(12) United States Patent
Liedtke (10) Patent No.: US 10,707,816 B2
(45) Date of Patent: *Jul. 7, 2020

(54) AMPLIFIER OUTPUT STAGE USING TOROIDAL TRANSFORMER

(71) Applicant: REAL ANALOG, LLC, Grosse Pointe Woods, MI (US)

(72) Inventor: Rudolph J. Liedtke, Grosse Pointe Park, MI (US)

(73) Assignee: REAL ANALOG, LLC, Grosse Pointe Woods, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/396,401

(22) Filed: Apr. 26, 2019

(65) Prior Publication Data

US 2019/0280657 A1 Sep. 12, 2019

Related U.S. Application Data

(63) Continuation of application No. 15/915,832, filed on Mar. 8, 2018, now Pat. No. 10,320,343.

(51) Int. Cl.
*H03F 3/181* (2006.01)
*H03F 3/22* (2006.01)
*H03F 1/32* (2006.01)

(52) U.S. Cl.
CPC ............... *H03F 3/181* (2013.01); *H03F 1/32* (2013.01); *H03F 3/22* (2013.01); *H03F 2200/03* (2013.01); *H03F 2200/534* (2013.01); *H03F 2201/3215* (2013.01)

(58) Field of Classification Search
USPC ..................................... 330/171, 195, 77, 81
See application file for complete search history.

(56) References Cited

U.S. PATENT DOCUMENTS

| | | | |
|---|---|---|---|
| 1,731,013 A | 10/1929 | Laughter | |
| 2,646,467 A * | 7/1953 | McIntosh | H03F 3/36 330/119 |
| 2,886,655 A | 5/1959 | Corderman | |
| 3,573,648 A * | 4/1971 | Nestorovic | H03F 3/28 330/82 |
| 4,717,889 A | 1/1988 | Engelmann | |
| 10,014,831 B1 * | 7/2018 | Buono | H03F 1/0211 |

FOREIGN PATENT DOCUMENTS

| | | |
|---|---|---|
| EP | 1548934 B1 | 9/2008 |
| WO | 2006086924 A1 | 8/2006 |

OTHER PUBLICATIONS

Van Der Veen, "The Secret of Selecting a Good Output Transformer", http://www.audio-talk.co.uk/fiultra/KISS%20117%20by%20Andre%20Jute.htm, 4 pages, 1998, 2005.

(Continued)

*Primary Examiner* — Hieu P Nguyen
(74) *Attorney, Agent, or Firm* — Brooks Kushman P.C.

(57) ABSTRACT

An audio amplifier includes an output stage including a first toroidal transformer with a first pair of secondary windings that are coupled in parallel across an output terminal. The output stage further includes a second toroidal transformer with a second pair of secondary windings that are connected in a series combination that is coupled across the output terminal.

13 Claims, 5 Drawing Sheets

(56) References Cited

OTHER PUBLICATIONS

Sears, "The Audio Signal Path; Minimising Power Supply Interaction", Vacuum Tube Audio, https://richardsears1.wordpress.com/2011/06/25/the-audio-signal-path-minimising-power-supply-interaction/, 18 pages, Jun. 25, 2011.
Vaughn, "Single Ended vs. Push Pull: The Fight of the Century", http://www.x3mhc.no/dokumenter/SE-v-PP-Part1.pdf, 10 pages, 2006.
Miller, "Essay: "Negative Feedback—Fact and Fantasy"—Oct. 1998", Secrets of Home Theater and High Fidelity, https://hometheaterhifi.com/volume_5_4/essaynegativefeedbackoctober98.html, 9 pages, 1998.
Van Der Veen, "Theory and Practise of Wide Bandwidth Toroidal Output Transformers", Presented at the 97th AES Convention Nov. 10-13, 1994 San Franscisco, https://pdfs.semanticscholar.org/ob79/254656db7fbcd6dd666caef8d3e89aceb005.pdf, 11 pages.

\* cited by examiner

AMPLIFIER OUTPUT STAGE USING TOROIDAL TRANSFORMER

REFERENCE TO RELATED APPLICATIONS

This application is a continuation of U.S. application Ser. No. 15/915,832 filed Mar. 8, 2018, now U.S. Pat. No. 10,320,343 issued on Jun. 11, 2019, the disclosure of which is hereby incorporated in its entirety by reference herein.

TECHNICAL FIELD

This application is generally related to the output stage of an audio amplifier.

BACKGROUND

Audio amplifiers are used to process low-level sound signals to provide an output suitable for a speaker. There are a variety of sources for the low-level sound signals. For example, the low-level sound signals may be received from a radio receiver, an instrument pickup, a microphone, a record album, a magnetic tape, or a compact disc (CD). The low-level sound signal may not be of sufficient volume to be heard. The low-level sound signals may be input to the audio amplifier and the audio amplifier may process the signals to generate an output signal that is suitable for a speaker output. Audio amplifiers are used in most any application that requires driving a speaker.

Various criteria may be used to evaluate the performance of audio amplifiers. For example, an audio amplifier may be evaluated by frequency response, gain, and distortion. Distortion evaluates how closely the output signal tracks the input signal. Although distortion has some interesting applications, a system with high distortion cannot be said to be reproducing the input signal accurately. Sophisticated listeners may prefer a system with low distortion as the output more closely represents the input signal.

SUMMARY

An audio amplifier includes first and second amplifying elements driven by associated control signals that are 180 degrees out of phase with each other. The audio amplifier further includes a first toroidal transformer with first and second primary windings coupled together at center terminals to a common voltage source and coupled in push-pull configuration to the first and second amplifying elements, and with first and second secondary windings that are coupled in parallel across output terminals. The audio amplifier further includes a second toroidal transformer with first and second primary windings coupled at center terminals to corresponding constant current sources and coupled in push-pull configuration to the first and second amplifying elements, and with first and second secondary windings that are coupled in series across the output terminals.

The first and second amplifying elements may be vacuum tube devices. The first toroidal transformer and the second toroidal transformer may be 60 Hertz power transformers having a pair of 120 Volt primary windings and a pair of 12 Volt secondary windings. The first and second amplifying elements may be solid-state transistor devices. Magnitudes of current supplied by the constant current sources may be balanced to prevent magnetic saturation of the first and second toroidal transformers over a predetermined frequency range. The audio amplifier may further include a non-polarized capacitor coupled between center terminals of the first and second primary windings of the second toroidal transformer. A magnitude of current supplied by each of the constant current sources may be selected to enable operation of the first and second amplifying elements in a Class A mode and the first and second amplifying elements may be operated in the Class A mode of operation.

An output stage for an audio amplifier includes a first toroidal transformer with a first pair of primary windings coupled together at center terminals to a common voltage source and coupled in push-pull configuration to first and second amplifying elements, and with a first pair of secondary windings that are coupled in parallel across output terminals. The output stage further includes a second toroidal transformer with a second pair of primary windings coupled at center terminals to separate constant current sources and coupled in push-pull configuration to the first and second amplifying elements, and with a second pair of secondary windings that are coupled in series across the output terminals.

The first and second amplifying elements may be driven by associated control signals that are 180 degrees out of phase from each other. The first and second amplifying elements may be vacuum tube devices, and the first toroidal transformer and the second toroidal transformer may be 60 Hertz power transformers having a pair of 120 Volt primary windings and a pair of 12 Volt secondary windings. Magnitudes of current supplied by the constant current sources may be balanced to prevent magnetic saturation of the first and second toroidal transformers over a predetermined frequency range. The first and second amplifying elements may be operated in a Class A mode of operation. The output stage may further include a non-polarized capacitor that is coupled between the center terminals of the second pair of primary windings.

An output stage for an audio amplifier includes a first toroidal transformer with a first pair of secondary windings that are coupled in parallel across output terminals. The output stage further includes a second toroidal transformer with a second pair of secondary windings that are connected in a series combination that is coupled across the output terminals.

The first toroidal transformer may include a first pair of primary windings coupled together at center terminals to a common voltage source and coupled in push-pull configuration to first and second amplifying elements, and the second toroidal transformer may include a second pair of primary windings coupled at center terminals to corresponding constant current sources and coupled in push-pull configuration to the first and second amplifying elements. The first and second amplifying elements may be vacuum tube devices, and the first toroidal transformer and the second toroidal transformer may be 60 Hertz power transformers in which the first and second pairs of secondary windings are 12 Volt windings and in which associated primary windings are 120 Volt windings. Magnitudes of current supplied by each of the constant current sources may be balanced to prevent magnetic saturation of the first and second toroidal transformers over a predetermined frequency range. The first and second amplifying elements may be operated in a Class A mode of operation. A gain of the first and second amplifying elements may be two. The output stage may further include a non-polarized capacitor that is coupled between the center terminals of the second pair of primary windings.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
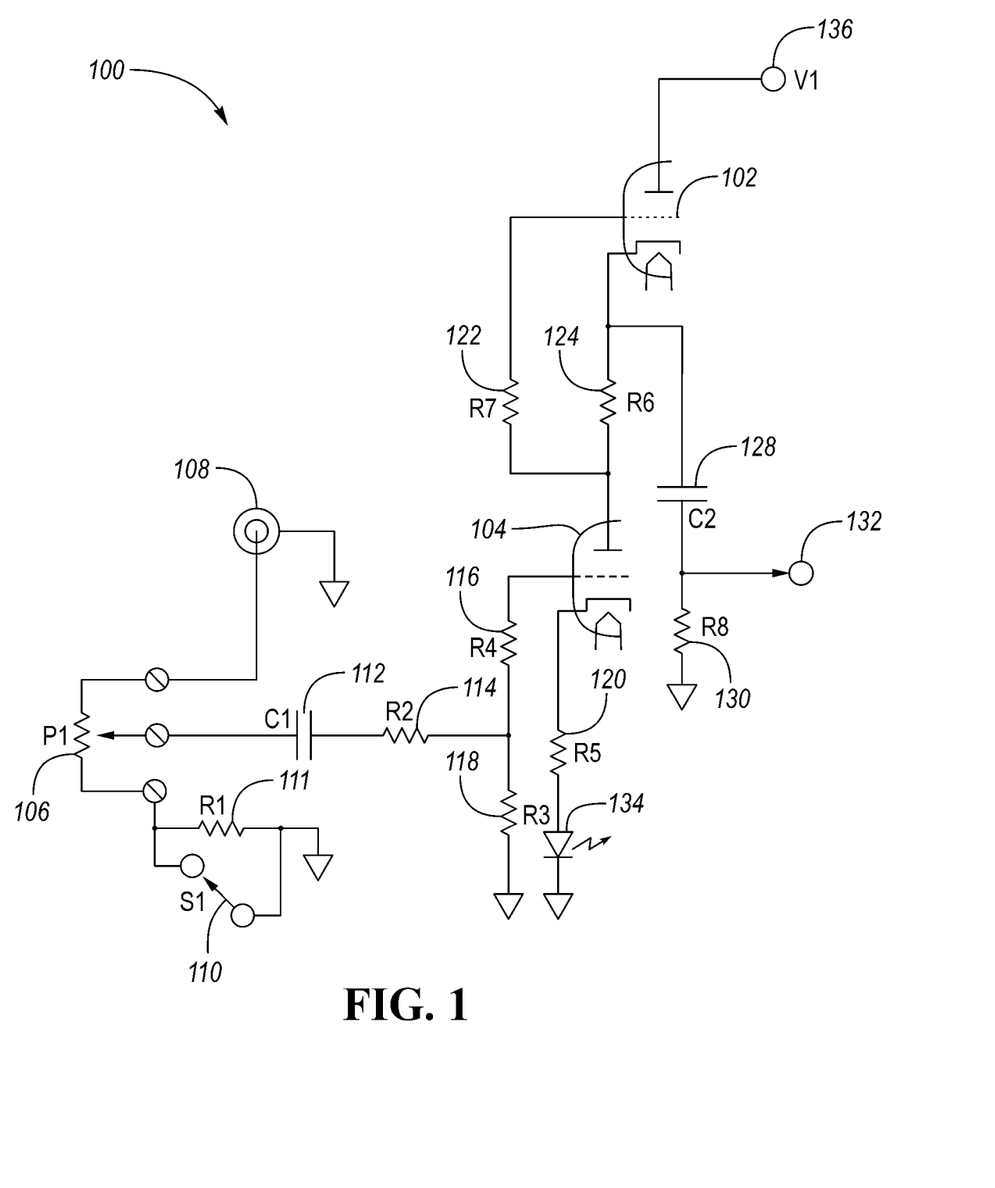
FIG. 1 depicts a possible first stage for an audio amplifier.

An audio amplifier may include a plurality of amplification stages. FIG. 1 depicts a first stage 100 for an audio amplifier that may be referred to as a mu-follower. The first stage 100 may be a high gain, low-output-impedance inverting stage. Characteristics of the mu-follower first stage 100 may be a high-power-supply-rejection ratio and a low non-linear distortion. The first stage 100 may include one or more amplification devices for increasing an amplitude of an incoming audio signal. The amplification devices may be solid-state devices or vacuum tube devices. The example depicted in FIG. 1 utilizes one or more vacuum tube devices.

The first stage 100 may receive an audio input signal from an audio input 108. The audio input 108 may be a connector or terminal through which an external device may provide an audio signal. For example, the audio signal may be from a receiver or other media playback device. The audio signal may create a voltage at the audio input 108. The audio input signal may be routed through a potentiometer P1 106 to adjust a volume of the audio input signal. For example, the potentiometer P1 106 may be a 100 KOhm audio taper potentiometer. The potentiometer P1 106 may be configured such that a voltage (e.g., the audio input signal) is applied across a fixed resistance and a voltage output at a variable resistance terminal is a percentage of the applied voltage that depends on a position of the potentiometer P1 106. The potentiometer P1 106 may operate as a voltage divider to scale an amplitude of the audio input signal to a user selected level. An output of the potentiometer P1 106 (e.g., from the variable resistance terminal) may be a scaled audio signal.

A resistance R1 111 (e.g., 100 KOhm) may be electrically coupled between a ground and a terminal of the potentiometer P1 106. A switch S1 110 may be electrically coupled in parallel across the resistance R1 111.

The variable resistance terminal of the potentiometer P1 106 may be electrically coupled to a capacitor C1 112 (e.g., 0.1 micro-Farads). The capacitor C1 112 may operate to filter the scaled audio signal. The capacitor C1 112 may be coupled to a resistance R2 114 (e.g., 10 KOhm). The resistance R2 114 may be coupled to a resistance R3 118 (e.g., 1 MOhm) that is also coupled to ground. The voltage across the resistance R3 118 may be input to a resistance R4 116 (e.g., 1 KOhm) that is electrically coupled to a grid terminal of a first triode 104. The audio signal input 108 may control operation of the first triode 104 by varying the voltage at the grid terminal.

A cathode terminal of the first triode 104 may be electrically coupled to ground through a resistance R5 120 (e.g., 100 Ohm) and a first light emitting diode (LED) 134. The first LED 134 may operate when current is flowing through the cathode terminal of the first triode 104 and may provide an indication that the amplifier is operating.

A plate (anode) terminal of the first triode 104 may be electrically coupled through a resistance R6 124 (e.g., 1 KOhm) to a cathode terminal of a second triode 102. The plate terminal of the first triode 104 may also be electrically coupled to a grid terminal of the second triode 102 through a resistance R7 122 (e.g., 1 KOhm). A plate terminal of the second triode 102 may be electrically coupled to a voltage source V1 136 (e.g., 300 VDC).

The cathode terminal of the second triode 102 may be electrically coupled to a first stage output 132 through a capacitor C2 128 (e.g., 0.47 micro-Farads). The capacitor C2 128 may be electrically coupled to ground through a resistance R8 130 (e.g., 1 MOhm). The first stage output 132 may be at a connection point of the capacitor C2 128 and the resistance R8 130.

In the example depicted, the first stage 100 includes the first triode 104 and the second triode 102. The triodes may be part of a 12AX7 vacuum-tube device. That is, the first triode 104 and the second triode 102 may be integrated into a single device. The signal at the plate terminal of the first triode 104 may be routed to the grid terminal of the second triode 102 that may be configured as a cathode follower. The cathode follower may be bootstrapped and act as a low output impedance constant current source (CCS). The gain of the first stage 100 may be equal to the mu (amplification factor) of the first triode 104. For example, for a 12AX7 device, the mu is approximately forty. An ultra linear response results from a constant current drive in a sink or source configuration as described by Ohms law.

Figure 2:
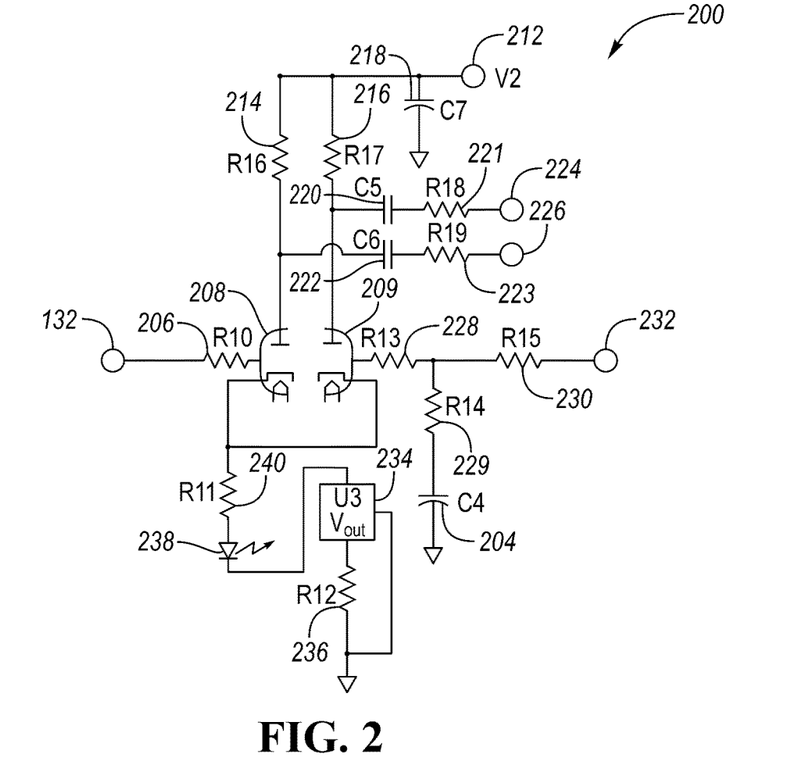
FIG. 2 depicts a possible second stage for an audio amplifier.

FIG. 2 depicts a second stage 200 that may be referred to as a differential amplifier summing point. The second stage 200 may receive the first stage output 132 as an input. The second stage 200 may include a third triode 208 and a fourth triode 209. The third triode 208 and the fourth triode 209 may be integrated into a single device (e.g., a dual triode). For example, the dual triode may be a 12AU7 vacuum-tube device. The dual triode may include two triodes within a single integrated package. The first stage output 132 may be electrically coupled to a grid terminal of the third triode 208 through a resistance R10 206.

The second stage 200 may include a cathode circuit coupled to the cathode terminals of the third triode 208 and the fourth triode 209. For example, a resistance R11 240 (e.g., 100 Ohms) may be coupled to the cathode terminals of the third triode 208 and the fourth triode 209. The resistance R11 240 may be further coupled to a second LED 238. The cathode circuit may include a precision constant current device 234 to regulate the current through the circuit to a constant value. The cathode circuit may include a resistor R12 236 (e.g., 249 Ohms) to adjust the current of the precision constant current device 234. In some configurations, the precision constant current device 234 may be a LM317. In this example, the resistor R12 236 may be selected as a ratio of 1.25 to the limit current. For example, the resistor R12 136 may be selected to regulate the current to 5 milliamps.

A second grid circuit may be configured to electrically couple a negative feedback input 232 to a grid terminal of the fourth triode 209. The second grid circuit may include a resistance R15 230 (e.g., 2.5 KOhm), a resistance R13 228 (e.g., 1 KOhm), and a network including a resistance R14 229 (e.g., 5.6 KOhm) in series with a capacitor C4 204 (e.g., 0.0015 micro-Farads). The negative feedback terminal 232 may be coupled to the resistance R15 230. The resistance R15 230 may be a feedback (inverting input) of a non-inverting operational amplifier in which the gain is 1.0 and adjusted by the resistance R14 229 and the capacitor C4 204 connected in series to form a high-pass filter that adjusts the frequency response. In some configurations, an optional capacitance may be coupled in parallel with resistance R15 230.

The second stage 200 may include a resistor R16 214 (e.g., 47 KOhm) coupling a second voltage source V2 212 (e.g., 380 VDC) to a plate terminal of the third triode 208. The plate terminal of the third triode 208 may also be coupled to a zero-degree phase shift output 226 through a series circuit that includes a capacitor C6 222 (e.g., 0.47 micro-Farads) and a resistance R19 223 (e.g., 220 KOhm).

The second stage 200 may include a resistor R17 216 (e.g., 47 KOhm) coupling the second voltage source V2 212 to a plate terminal of the fourth triode 209. The plate terminal of the fourth triode 209 may also be coupled to a 180-degree phase shift output 224 through a series circuit that includes a capacitor C5 220 (e.g., 0.47 micro-Farads) and a resistance R18 221 (e.g., 220 KOhm).

The differential amplifier may be the summing point for the negative feedback loop from the final output. Many amplifiers have a large open-loop gain and apply as much negative feedback as possible. The amplifier disclosed herein limits the amount of feedback so that the output impedance is less than 1 ohm and the damping factor is approximately 10. Negative feedback may not adequately compensate for odd and even harmonics and, according to some audiophiles, the listening experience with a large amount of negative feedback is harsh. The total open-loop gain of the feedback loop is approximately 25. This is quite small relative to a typical integrated circuit linear amplifier. The present amplifier design tries to express the natural subtle sound of the vacuum tubes to the listener. In addition, the first linear mu stage is not part of the feedback loop and has a gain of 40 to emphasize the vacuum tube sound further.

In addition to being the summing point, the differential amplifier is a precise phase inverter because of the common cathodes driven by a constant current source. The input from the mu-follower (e.g., first stage output 132) is 180 degrees out of phase with respect to the audio input signal (e.g., audio input 108). Therefore, the corresponding plate (e.g., anode/plate terminal of the third triode 208) is zero degrees out of phase and the negative feedback input is 180 degrees out of phase at its respective plate (e.g., anode/plate terminal of the fourth triode 209).

Figure 3:
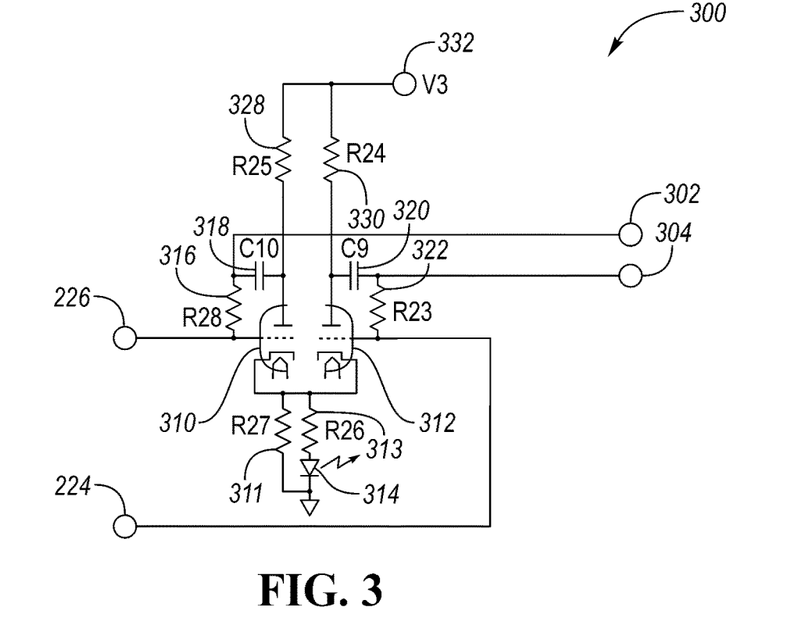
FIG. 3 depicts a possible third stage for an audio amplifier.

FIG. 3 depicts a third stage 300 that may be referred to a power drive circuit. The third stage 300 may include a fifth triode 310 and a sixth triode 312. The fifth triode 310 and the sixth triode 312 may be integrated into a single device (e.g., a dual triode). For example, the dual triode may be a 12AU7 device.

The third stage 300 may include a cathode circuit that includes a resistance R27 311 (e.g., 2.4 KOhm), a resistance R26 313 (e.g., 1.5 KOhm) and a third LED 314. The cathodes of the fifth triode 310 and the sixth triode 312 may be electrically connected and coupled to ground through a parallel combination of the resistance R27 311 and a series combination of the resistance R26 313 and the third LED 314.

A third voltage source V3 332 (e.g., 450 VDC) may be electrically coupled to a plate terminal of the fifth triode 310 through a resistance R25 328 (e.g., 47 KOhm). The third voltage source V3 332 may be electrically coupled to a plate terminal of the sixth triode 312 through a resistance R24 330 (e.g., 47 KOhm).

The zero-degree phase shift output 226 of the second stage 200 may be electrically coupled to a grid terminal of the fifth triode 310. The grid terminal of the fifth triode 310 may be electrically coupled to an amplified zero-degree phase output 302 through a resistance R28 316 (e.g., 1 MOhm). The plate terminal of the fifth triode 310 may be electrically coupled to the amplified zero-degree output terminal 302 through a capacitor C10 318 (e.g., 0.47 micro-Farads).

The 180-degree phase shift output 224 of the second stage 200 may be electrically coupled to a grid terminal of the sixth triode 312. The grid terminal of the sixth triode 312 may be electrically coupled to an amplified 180-degree phase output 304 through a resistance R23 322 (e.g., 1 MOhm). The plate terminal of the sixth triode 312 may be electrically coupled to the amplified 180-degree output terminal 304 through a capacitor C9 320 (e.g., 0.47 micro-Farads).

The third stage 300, which may be referred to as a power drive circuit, is also a differential amplifier that multiplies the 0- and 180-degree phase inverter output by a factor of three. This is achieved by local negative feedback that is referenced to zero volts by capacitive coupling at the input and the output. The input resistors (e.g., R19 223 and R18 221 from FIG. 2) may be configured with a resistance value of 220 Kohms and the feedback resistors (e.g., R28 316 and R23 322) may have a value of 1 MOhms. Triode feedback is similar to an operational amplifier inverter except the open-loop gain is only about twenty. The purpose of this dual triode is to drive the control input of the next stage amplifier with enough AC voltage to achieve a 15-Watt final output under class A operating conditions (always on). To achieve this, the power supply voltage (e.g., third voltage source V3 332) may be the same voltage that is used in the next stage. Power supply ripple rejection is good since each triode plate is 180 degrees out of phase thereby cancelling any 60 Hz hum or common mode noise.

Figure 4:
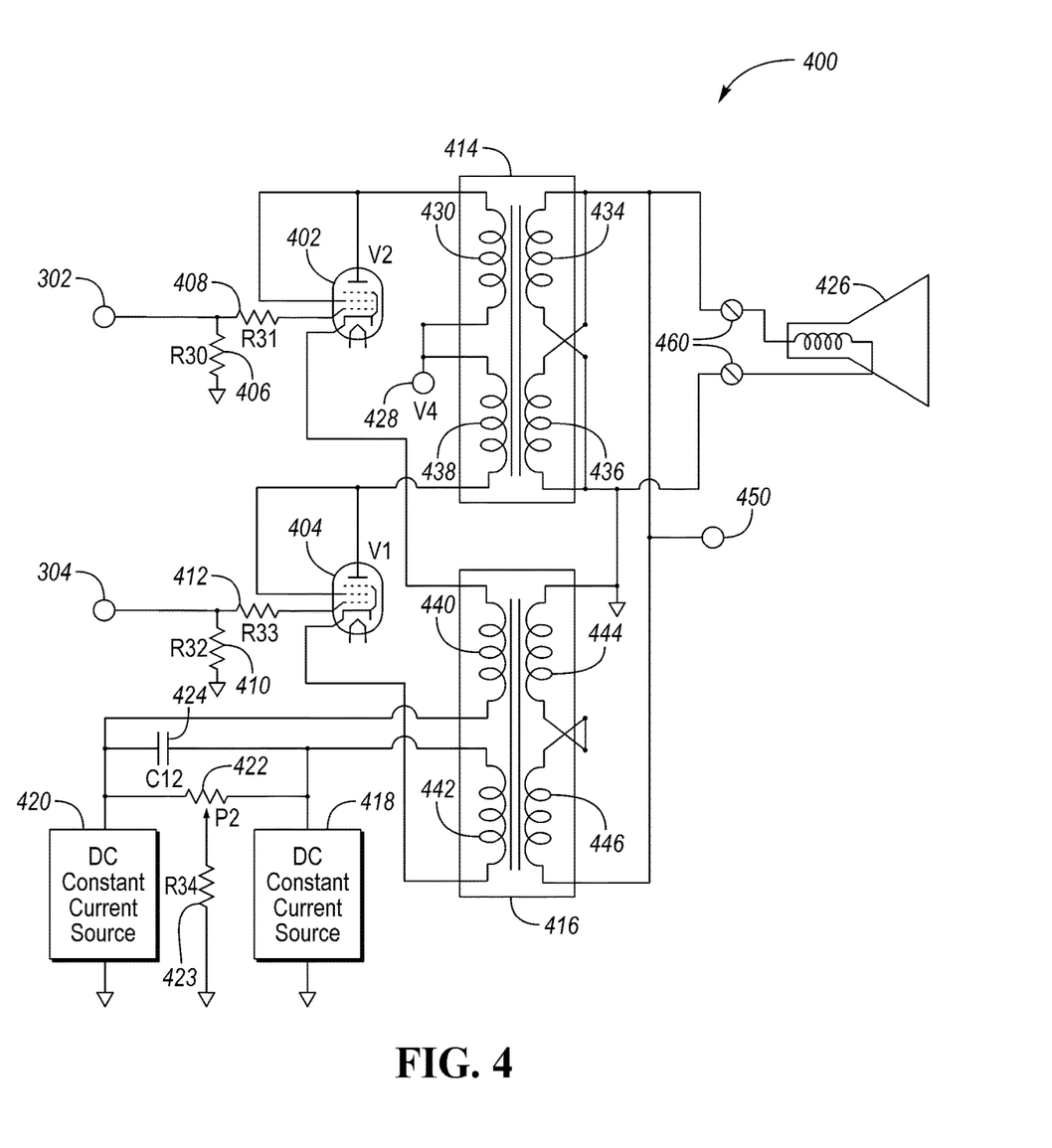
FIG. 4 depicts a possible output stage for an audio amplifier implemented with vacuum tube amplifiers.
Figure 6:
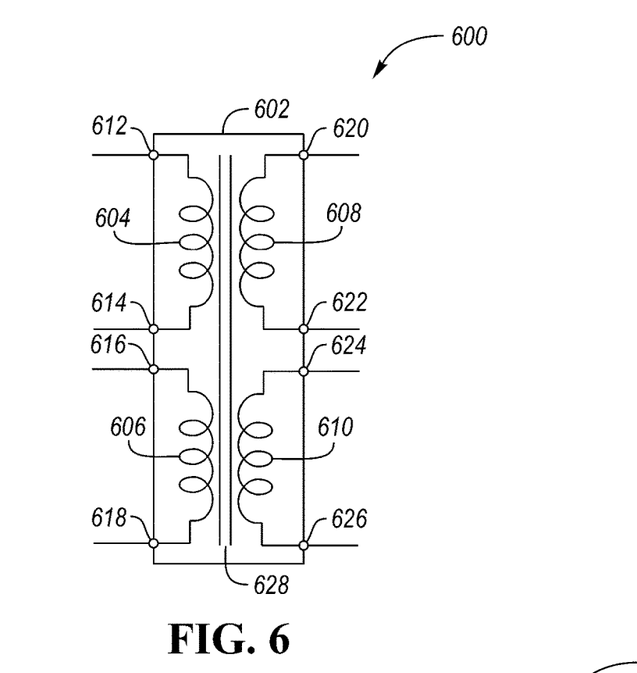
FIG. 6 depicts a schematic diagram representing a toroidal transformer.

FIG. 4 depicts a fourth stage 400 that may be referred to as the output stage of the audio amplifier. The fourth stage 400 may include a first toroidal transformer 414 and a second toroidal transformer 416. FIG. 6 depicts a schematic diagram 600 representing a toroidal transformer 602. The toroidal transformer 602 may include a pair of primary windings and a pair of secondary windings wound around a toroidal core. The toroidal transformer 602 may include a first primary winding 604 and a second primary winding 606. Electrical connections to the first primary winding 604 may be defined by a first terminal 612 and a second terminal 614. Electrical connection to the second primary winding 606 may be defined by a third terminal 616 and a fourth terminal 618. The second terminal 614 and the third terminal 616 may be referred to as center terminals. Alternatively, when the second terminal 614 and the third terminal 616 are electrically coupled, the connection may be referred to the center terminal.

The toroidal transformer 602 may include a first secondary winding 608 and a second secondary winding 610. Electrical connections to the first secondary winding 608 may be defined by a fifth terminal 620 and a sixth terminal 622. Electrical connection to the second secondary winding 610 may be defined by a seventh terminal 624 and an eighth terminal 626. The primary and secondary windings may be made around a magnetic core 628. The magnetic core 628 may be a circular ring (e.g., donut shape) made of iron or iron compound.

The toroidal transformer 602 may be configurable as the first primary winding 604 and the second primary winding 606 may be connected in series or parallel. Similarly, the first secondary winding 608 and the second secondary winding 610 may be connected in series or parallel. For example, to connect a circuit to the series combination of the primary windings, the second terminal 614 and the third terminal 616 may be electrically connected (e.g., center terminals connected). In this configuration, the circuit coupled to the first terminal 612 and the fourth terminal 618 will be coupled to the primary winding coupled in series.

To connect a circuit to the series combination of secondary windings, the sixth terminal 622 and the seventh terminal 624 may be electrically connected (e.g., center terminals connected). In the series configuration, a circuit coupled between the fifth terminal 620 and the eighth terminal 626 may be electrically connected to the series combination of the secondary windings. The secondary windings may be coupled in a parallel configuration by coupling the fifth terminal 620 to the seventh terminal 624 and by coupling the sixth terminal 622 to the eighth terminal 626. In this configuration, a circuit coupled across the fifth terminal 620 and the eighth terminal 626 will be across the parallel combination of the first secondary winding 608 and the second secondary winding 610.

The toroidal transformer 602 may be constructed to have a 10:1 ratio between the primary windings and the secondary windings in a configuration using vacuum tubes. The toroidal transformer 602 may be a 60 Hertz power transformer configured so that the first and second primary windings are rated at 120 Volts and the first and second secondary windings are rated at 12 Volts. For example, the toroidal transformer 602 may be configured to input 240 Volts when the primary windings are coupled in series and 120 Volts when the primary windings are coupled in parallel. The toroidal transformer 602 may output 12 Volts across the parallel combination of the secondary windings and 24 Volts across the series combination of the secondary windings. The toroidal transformer 602 may be constructed to have a 1:1 ratio between the primary windings and the secondary windings in a configuration using solid-state amplifying devices.

The toroidal transformer has an enclosed magnetic field and has a more efficient coupling than conventional air-gap transformers. The entire path of the symmetrical magnetic field is within the high permeability core in which there are no air gaps. The magnetic flux of the windings is oriented in the same direction as the circular core resulting in high efficiencies a reduced leakage reactance. The symmetry of the toroidal transformer reduces the amount of magnetic flux that leaks from the core resulting in higher efficiency and lower electromagnetic emissions.

Referring again to FIG. 4, the fourth stage 400 may include a first amplifying device and a second amplifying device. For example, the first amplifying device may be a first pentode 402 and the second amplifying device may be a second pentode 404. The amplifying devices may be 6L6 GC beam power pentodes. The amplified zero-degree phase shift output 302 of the third stage 300 may be electrically coupled to a control grid of the first pentode 402 through a circuit that includes a resistance R30 406 (e.g., 270 KOhm) and a resistance R31 408 (e.g., 1 KOhm). The amplified 180-degree phase shift output 304 of the third stage 300 may be electrically coupled to a control grid of the second pentode 404 through a circuit that includes a resistance R32 410 (e.g., 270 KOhm) and a resistance R33 412 (e.g., 1 KOhm).

A plate of the first pentode 402 may be electrically coupled to a terminal of the first toroidal transformer 414. A plate of the second pentode 404 may be electrically coupled to a terminal of the first toroidal transformer 414. The first toroidal transformer 414 may be configured such that the center terminals are electrically connected to one another and electrically coupled to a fourth power supply V4 428 (e.g., 425 VDC). The center terminals may be connected to a common voltage source. The fourth power supply V4 428 may be electrically coupled to the plate of the first pentode 402 through a first primary winding 430 of the first toroidal transformer 414. The fourth power supply V4 428 may be electrically coupled to the plate of the second pentode 404 through a second primary winding 432 of the first toroidal transformer 414. The primary windings (430, 432) of the first toroidal transformer 414 may be connected in a push-pull configuration with the plates of the first pentode 402 and the second pentode 404. A screen terminal of the first pentode 402 may be electrically coupled to the plate of the first pentode 402. A screen terminal of the second pentode 404 may be electrically coupled to the plate of the second pentode 404.

A cathode of the first pentode 402 may be electrically coupled to a terminal of the second toroidal transformer 416. A cathode of the second pentode 404 may be electrically coupled to a terminal of the second toroidal transformer 416. The cathode of the first pentode 402 may be electrically coupled to a first primary winding 440 of the second toroidal transformer 416. The cathode of the second pentode 404 may be electrically coupled to a second primary winding 442 of the second toroidal transformer 416. The primary windings (440, 442) of the second toroidal transformer 416 may be connected in a push-pull configuration to the cathodes of the first pentode 402 and the second pentode 404. Each of the primary windings (e.g., 440, 442) of the second toroidal transformer 416 may be coupled at center terminals to corresponding constant current sources. A center terminal of the first primary winding 440 of the second toroidal transformer 416 may be electrically coupled to a first constant current source 420. A center terminal of the second primary winding 442 of the second toroidal transformer 416 may be electrically coupled a second constant current source 418. A capacitor C12 424 (e.g., 100 micro-Farads) may be electrically coupled between the center terminals of the second toroidal transformer 416. The capacitor C12 424 may function as an AC bypass. The capacitor C12 424 may be located at an point in the circuit where each cathode transformer primary winding connections terminates at their respective constant current source. The capacitor C12 424 may be a non-polarized AC capacitor that maintains the signal path of the amplified AC signal in the power tubes. The capacitor C12 424 may also isolate the DC constant current sources from the AC signal.

The first constant current source 420 and the second constant current source 418 may be LM317HV devices. The first constant current source 420 and the second constant current source 418 may be configured to provide a constant DC current through the circuit. For example, a current of 75 milli-Amps may be selected. In some configurations, a potentiometer P2 422 may be electrically coupled between the center terminals of the second toroidal transformer 416. A center terminal of the potentiometer P2 422 may be electrically coupled to ground through a resistance R34 423. The potentiometer P2 422 and the resistance R34 423 may be adjustable to balance the DC current between the two legs of the circuit.

A magnitude of current supplied by each of the constant current sources (e.g., first constant current source 420 and second constant current source 418) may be balanced to prevent magnetic saturation of the first and second toroidal transformers (414, 416) over a predetermined frequency range. For example, the magnitude of current supplied by each of the constant current sources may be equal or balanced. A magnitude of current supplied by each of the constant current sources may be selected to enable operation of the amplifying devices in a Class A mode and the amplifying elements may be operated in the Class A mode of operation.

The first secondary winding 434 and the second secondary winding 436 of the first toroidal transformer 414 may be electrically coupled in parallel across output terminals 460 of the amplifier. The output terminals 460 may be configured to provide an electrical connection to one or more speakers. A speaker 426 may be electrically coupled across the output terminals 460. Center terminals of the first toroidal transformer 414 may be connected as depicted to achieve the parallel connection of the secondary windings. The first secondary winding 444 and the second secondary winding 446 of the second toroidal transformer 416 may be electrically connected in series across the output terminals 460 of the amplifier. Center terminals of the secondary windings of the second toroidal transformer 416 may be electrically connected as depicted to achieve the series connection. A negative feedback signal 450 may be derived from the electrical connection at one of the output terminals 460 configured to couple to the speaker 426. The negative feedback signal 450 may be electrically connected to the negative feedback input 232 of the second stage 200.

The fourth stage may include two power vacuum tubes (e.g., 402, 404) and two identical 50-Watt toroidal power transformers (e.g., 414, 416). The cathode connections are separate and each is driven by the corresponding precision direct current (DC) constant current source (e.g., 420, 418). As a result, the plate terminals and the vacuum tubes have precisely the same balanced (nulled) current from two identical constant current sources. This prevents the toroidal transformers (e.g., 414, 416) from magnetic saturation over a broad frequency range and preserves the efficient coupling, inductive and capacitive characteristics of the toroidal transformers (e.g., 414, 416).

The first toroidal transformer 414 has two secondary windings (434, 436) that are connected in parallel to lower the output impedance. The second toroidal transformer 416 has two secondary windings (444, 446) that are connected in series. The secondary windings of the first toroidal transformer 414 are then connected in parallel with the series combination of the secondary windings of the second toroidal transformer 416 thereby producing a precise ratio of 2:1 between the plate and cathode of each vacuum tube (e.g., a gain of 2). This secondary connection configuration is a form of local negative feedback that forces the amplifying devices in an ultra linear operating mode thereby improving their frequency response, output impedance, and distortion.

The vacuum tubes (402, 404) may be operated in true class A push-pull mode since each constant current source is always on and independent of the AC signal on the vacuum tube control grid. In the class A mode of operation, the amplifying elements are biased on so that elements conduct for each cycle of the input waveform. This mode of operation prevents any class B switching noise and reduces the amount of negative feedback. However, some negative feedback is needed to maintain an acceptable damping factor, output impedance, and low distortion. In addition, reducing negative feedback helps improve the subtle sound characteristics of the vacuum tubes.

Each control input of the amplifying devices may be 180 degrees out of phase with respect to one another. The control inputs are capacitively coupled and driven by an active balanced phase inverter so that each half of the output circuit is operating as a true push pull circuit. This balanced push pull configuration greatly reduces harmonics and produces an exact reproduction of the input signal through the toroidal transformers.

In the actual design, 6L6 GC or 7581 GC beam power pentodes may be used due to cost and availability. Pentodes are generally used in class AB mode, meaning that they switch on and off through the positive and negative half of the amplified input signal. In addition, the 6L6 GC plate resistance (triode connection) is a good match for the 120 VAC primary of the toroidal transformer coupled to the plates. Both 6L6s may be configured as triodes by connecting their screen grid to the plate and operating them in class A mode. This avoids any switching noise and reduces the power output to about 15 Watts continuous RMS. However, most high-power triodes or pentodes may work depending on their plate resistances and power output.

Figure 5:
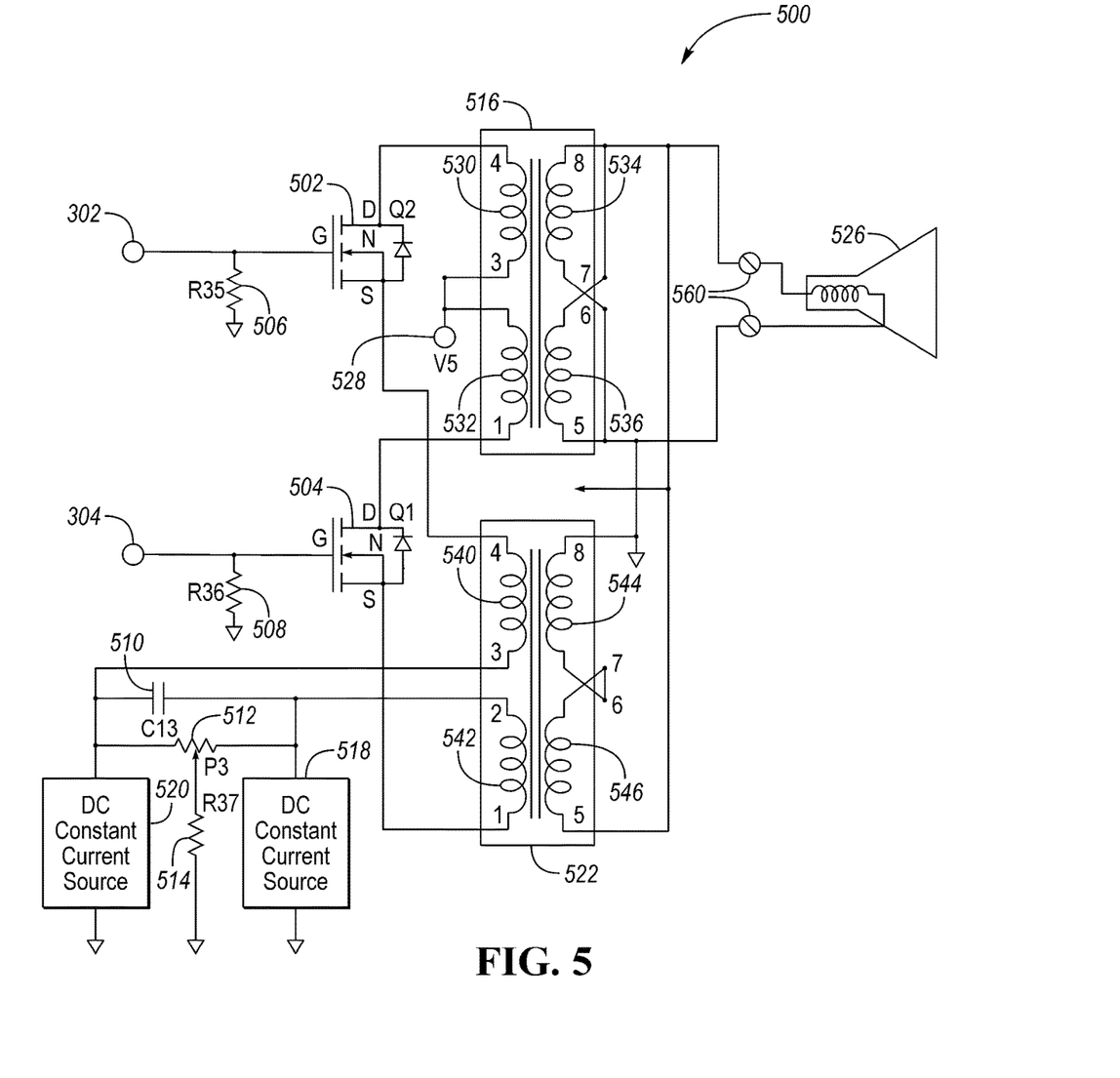
FIG. 5 depicts a possible output stage for an audio amplifier implemented with solid-state amplifiers.

FIG. 5 depicts another configuration for a fourth stage 500. The fourth stage 500 may include a first amplifying device and a second amplifying device. For example, the amplifying devices may be solid-state transistor devices such as a Metal-Oxide-Semiconductor Field-Effect Transistor (MOSFET). The amplified zero-degree phase shift output 302 of the third stage 300 may be electrically coupled to a gate input of a first MOSFET 502 through a circuit that includes a resistance R35 506. The amplified 180-degree phase shift output 304 of the third stage 300 may be electrically coupled to a gate input of a second MOSFET 504 through a circuit that includes a resistance R36 508.

A drain terminal of the first MOSFET 502 may be electrically coupled to a terminal of the first toroidal transformer 516. A drain terminal of the second MOSFET 504 may be electrically coupled to a terminal of the first toroidal transformer 516. The first toroidal transformer 516 may be configured such that the center terminals are electrically connected to one another and electrically coupled to a fifth power supply V5 528 (e.g., 48 VDC). The fifth power supply 528 may be electrically coupled to the drain terminal of the first MOSFET 502 through a first primary winding 530 of the first toroidal transformer 516. The fifth power supply 528 may be electrically coupled to the drain terminal of the second MOSFET 504 through a second primary winding 532 of the first toroidal transformer 516. The primary windings of the first toroidal transformer 516 may be connected in a push-pull configuration with the drain terminals of the first MOSFET 502 and the second MOSFET 504. A diode may be coupled between the source and drain terminals of each of the MOSFETs.

A source terminal of the first MOSFET 502 may be electrically coupled to a terminal of the second toroidal transformer 522. A source terminal of the second MOSFET 504 may be electrically coupled to a terminal of the second toroidal transformer 522. The source terminal of the first MOSFET 502 may be electrically coupled to a first primary winding 540 of the second toroidal transformer 522. The source terminal of the second MOSFET 504 may be electrically coupled to a second primary winding 542 of the second toroidal transformer 522. The primary windings of the second toroidal transformer 522 may be connected in a push-pull configuration to the source terminals of the first MOSFET 502 and the second MOSFET 504. A center terminal of the first primary winding 540 of the second toroidal transformer 522 may be electrically coupled to a first constant current source 520. A center terminal of the second primary winding 542 of the second toroidal transformer 522 may be electrically coupled a second constant current source 518. A capacitor C13 510 may be electrically coupled between the center terminals of the second toroidal transformer 522. The capacitor C13 510 may function as an AC signal bypass. The capacitor C13 510 may be located at a point in the circuit where each source transformer primary winding connections terminates at their respective constant current source. The capacitor C13 510 may be a non-polarized AC capacitor that maintains the signal path of the amplified AC signal in the power tubes. The capacitor C13 510 may also isolate the DC constant current sources from the AC signal.

The first constant current source 520 and the second constant current source 518 may be LM317HV devices. The first constant current source 520 and the second constant current source 518 may be configured to provide a constant DC current through the circuit. For example, a current of 2.5 Amps may be selected. In some configurations, a potentiometer P3 512 may be electrically coupled between the center terminals of the second toroidal transformer 522. A center terminal of the potentiometer P3 512 may be electrically coupled to ground through a resistance R37 514. The potentiometer P3 512 and the resistance R37 514 may be adjustable to provide a balanced DC current between the two legs of the circuit.

A magnitude of current supplied by each of the constant current sources (e.g., first constant current source 520 and second constant current source 518) may be selected to prevent magnetic saturation of the first and second toroidal transformers (516, 522) over a predetermined frequency range. For example, the magnitude of current supplied by each of the constant current sources may be equal or balanced. A magnitude of current supplied by each of the constant current sources may be selected to enable operation of the amplifying devices in a Class A mode and the amplifying elements may be operated in the Class A mode of operation.

The first secondary winding 534 and the second secondary winding 536 of the first toroidal transformer 516 may be electrically coupled in parallel across output terminals 560 of the amplifier. The output terminals 560 may be configured to provide an electrical connection to one or more speakers. A speaker 526 may be coupled across the output terminals 560. Center terminals of the first toroidal transformer 516 may be connected as depicted to achieve the parallel connection of the secondary windings. The first secondary winding 544 and the second secondary winding 546 of the second toroidal transformer 522 may be electrically connected in series across the output terminals 560 of the amplifier. Center terminals of the secondary windings of the second toroidal transformer 522 may be electrically connected as depicted to achieve the series connection.

The solid-state amplifier may operate at lower voltages compared to the vacuum-tube amplifier. The other stages may be modified to be compatible with voltage and current levels of the solid-state output stage 500. In addition, the previous stages may be alternatively implemented with solid-state devices. The solid-state amplifier may operate at voltage levels such that the final output may be connected directly to the speakers. This offers the possibility of eliminating the output transformers. However, typical solid-state amplifiers are operated in class AB mode and require circuitry to eliminate transient noise without the benefit of the output transformer.

Transformer coupled audio amplifiers typically have air gap output transformers to prevent magnetic saturation. These are sometimes called "IE" transformers because of the way the iron core is constructed. The accurate winding and building of audio "IE" transformers is labor intensive and expensive causing the cost of typical output transformers to be well over one hundred dollars depending on the output power and quality. A high quality "IE" transformer must reduce transients during class B switching and have good mutual inductances at low frequencies.

Figure 7:
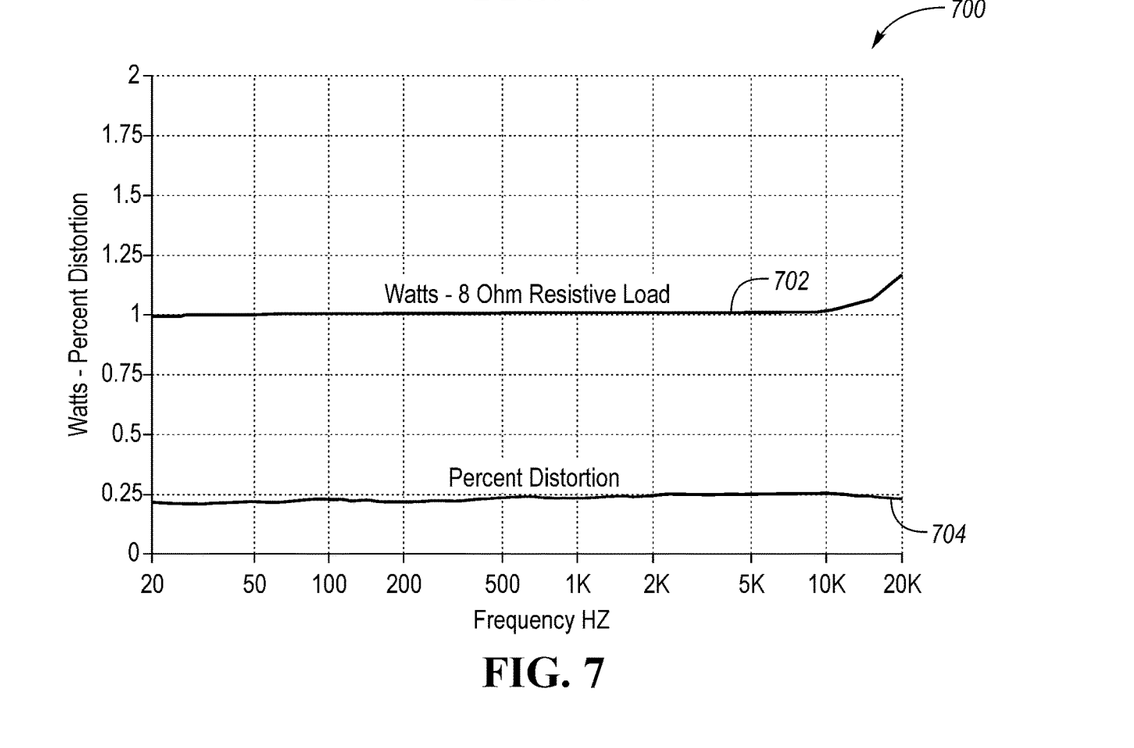
FIG. 7 depicts a plot of distortion over a range of frequencies for the audio amplifier disclosed herein.

The selection of the dual toroidal transformer properties may be dependent upon the type of amplification devices that are to be used (e.g., vacuum tube vs. solid-state). For example, for vacuum tube applications, the dual toroidal transformers may be 60 Hz power transformers having a pair of 120 VAC primary windings and a pair of 12 Volt secondary windings. Typical performance of the audio amplifier is illustrated in FIG. 7. FIG. 7 depicts a performance chart 700 for a frequency response of an audio amplifier utilizing a 60 Hz, 50-Watt toroidal power transformer. The chart illustrates a graph of power 702 and distortion 704 as a function of frequencies between 20 Hz and 20 KHz. In this example, the audio amplifier is operated at a power of 1 Watt. The audio amplifier demonstrates a low distortion 704 with values below 0.25% over the tested frequency range.

The manner in which the primary windings are connected helps to ensure that the magnetic core is not magnetically saturated. Current flow through each of the primary windings of the transformers will be in opposite directions, causing a magnetic flux in the opposite direction. When the DC biasing currents are equal in each of the circuits, the magnetic fluxes will cancel resulting in no magnetization of the core. Care may be taken to ensure that the magnetic core is not magnetically saturated with any unbalanced DC current. This is particularly relevant at low frequencies. The constant current sources may be adjusted to ensure that the DC biasing currents are equal through each of the amplifying devices.

The amplifying devices may be biased to operate in the linear region by the constant current sources. The magnitude of the current provide by the constant current sources may be selected to bias the amplifying device for linear operation. Further, the magnitude of the current may be selected to place the amplifying devices in a Class A mode of operation. In the class A mode of operation, the amplifying device is always conducting or on. The magnitude of the current selected may depend on the type of the amplifying device (e.g., vacuum tube or solid-state).

In the configuration shown, the amplifying devices are driven by associated control signals that are 180 degrees out of phase with one another. This allows the amplifying devices to operate in a push-pull mode of operation. As one of the amplifying devices conducts more, the other will conduct less. These currents are out of phase and the result is that the current through the primary winding of the transformer has a peak value twice that of either individual device current.

The Precision Toroidal Output Amplifier uses two output transformers, each having two secondary windings. One of the output transformers is in the plate (or drain) circuit, while the other is in the cathode (or source) circuit. The plate (or drain) secondaries are connected in a parallel combination and the cathode (or source) secondaries are connected in a series combination. The series combination and the parallel combination are combined in parallel producing a ratio of 2:1 (e.g., cathode to plate gain of 2). The transformers form a local negative feedback loop that forces the amplifying devices into linear operation using class A push-pull mode. This reduces output power but significantly improves the sound quality.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. An output stage for an AC audio amplifier comprising:
a first toroidal transformer with a first pair of secondary windings that are coupled in parallel across AC audio output terminals providing a first coupling ratio across said AC audio output terminals; and
a second toroidal transformer with a second pair of secondary windings that are connected in a series combination that is coupled across the AC audio output terminals providing a second coupling ratio across said AC output terminals;
wherein the first coupling ratio is greater than the second coupling ratio.

2. The output stage of claim 1 wherein the first toroidal transformer further comprises a first pair of primary windings coupled together at center terminals to a common voltage source and coupled in push-pull configuration to first and second amplifying elements, and the second toroidal transformer further comprises a second pair of primary windings coupled at center terminals to corresponding constant current sources and coupled in push-pull configuration to the first and second amplifying elements.

3. The output stage of claim 2 wherein the first and second amplifying elements are vacuum tube devices, and the first toroidal transformer and the second toroidal transformer are 60 Hertz power transformers in which the first and second pairs of secondary windings are 12 Volt windings and in which associated primary windings are 120 Volt windings.

4. The output stage of claim 2 wherein magnitudes of current supplied by each of the constant current sources are balanced to prevent magnetic saturation of the first and second toroidal transformers over a predetermined frequency range.

5. The output stage of claim 2 wherein the first and second amplifying elements are operated in a Class A mode of operation.

6. The output stage of claim 2 wherein a gain of the first and second amplifying elements is two.

7. The output stage of claim 2 further comprising a non-polarized capacitor that is coupled between the center terminals of the second pair of primary windings.

8. An output stage for an AC audio amplifier comprising:
a first toroidal transformer with a first pair of secondary windings that are coupled in parallel across AC audio output terminals; and
a second toroidal transformer with a second pair of secondary windings that are connected in a series combination that is coupled across the AC audio output terminals;
wherein the first toroidal transformer further comprises a first pair of primary windings coupled together at center terminals to a common voltage source and coupled in push-pull configuration to first and second amplifying elements, and the second toroidal transformer further comprises a second pair of primary windings coupled at center terminals to corresponding constant current sources and coupled in push-pull configuration to the first and second amplifying elements.

9. The output stage of claim 8 wherein the first and second amplifying elements are vacuum tube devices, and the first toroidal transformer and the second toroidal transformer are 60 Hertz power transformers in which the first and second pairs of secondary windings are 12 Volt windings and in which associated primary windings are 120 Volt windings.

10. The output stage of claim 8 wherein magnitudes of current supplied by each of the constant current sources are balanced to prevent magnetic saturation of the first and second toroidal transformers over a predetermined frequency range.

11. The output stage of claim 8 wherein the first and second amplifying elements are operated in a Class A mode of operation.

12. The output stage of claim 8 wherein a gain of the first and second amplifying elements is two.

13. The output stage of claim 8 further comprising a non-polarized capacitor that is coupled between the center terminals of the second pair of primary windings.

* * * * *